(12) United States Patent
Gilliland et al.

(10) Patent No.: US 7,310,243 B2
(45) Date of Patent: Dec. 18, 2007

(54) METHOD AND COMPONENTS FOR IMPLEMENTING EMC SHIELDED RESONANCE DAMPING

(75) Inventors: Don Alan Gilliland, Rochester, MN (US); Dennis James Wurth, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 624 days.

(21) Appl. No.: 10/865,251

(22) Filed: Jun. 10, 2004

(65) Prior Publication Data

US 2006/0011369 A1  Jan. 19, 2006

(51) Int. Cl.
*H05K 9/00* (2006.01)
(52) U.S. Cl. ............... 361/818; 361/816; 361/800; 361/753; 361/799; 333/12; 174/32; 174/350
(58) Field of Classification Search ............... 361/800, 361/816, 818, 753, 799; 174/350, 351, 32; 333/12; 334/85; 331/67; 307/91
See application file for complete search history.

(56) References Cited

U.S. PATENT DOCUMENTS

| | | | | | |
|---|---|---|---|---|---|
| 3,638,147 | A | * | 1/1972 | Denes | 333/182 |
| 5,923,523 | A | * | 7/1999 | Herbert | 361/306.1 |
| 5,978,231 | A | * | 11/1999 | Tohya et al. | 361/782 |
| 6,498,710 | B1 | | 12/2002 | Anthony | |
| 6,525,622 | B1 | * | 2/2003 | Novak et al. | 333/32 |
| 6,532,439 | B2 | | 3/2003 | Anderson et al. | |
| 6,618,266 | B2 | | 9/2003 | Blakely et al. | |
| 6,674,338 | B2 | * | 1/2004 | Novak | 333/32 |
| 6,687,127 | B2 | * | 2/2004 | Takami | 361/719 |
| 6,727,780 | B2 | * | 4/2004 | Novak et al. | 333/136 |
| 6,870,436 | B2 | * | 3/2005 | Grebenkemper | 333/12 |
| 6,972,967 | B2 | * | 12/2005 | Norte et al. | 361/818 |
| 7,088,592 | B2 | * | 8/2006 | Su et al. | 361/753 |
| 2003/0076197 | A1 | | 4/2003 | Novak et al. | |

OTHER PUBLICATIONS

Chen et al, "Optimum Placement of Decoupling Capacitors on Packages and Printed Circuit Boards Under the Guidance of Electromagnetic Field Simulation", 46th Electronic Components & Technology Conference, Conference Proceedings, pp. 756-760, May 1996.

* cited by examiner

*Primary Examiner*—Dean A. Reichard
*Assistant Examiner*—Dameon E. Levi
(74) *Attorney, Agent, or Firm*—Joan Pennington

(57) ABSTRACT

A method and components are provided for implementing EMC shielded resonance damping of a printed circuit board. The EMC shielded resonance damping component includes a capacitor and resistor formed in series combination and contained within a shielded enclosure. A pair of coaxial pads is provided for connection to the printed circuit board. The series combination of the capacitor and resistor is connected between a first pad of a pair of coaxial pads and an interior wall of the shielded enclosure. The shielded enclosure provides a return current path to a second pad of the pair of coaxial pads through the series components.

20 Claims, 6 Drawing Sheets

METHOD AND COMPONENTS FOR IMPLEMENTING EMC SHIELDED RESONANCE DAMPING

FIELD OF THE INVENTION

The present invention relates generally to the data processing field, and more particularly, relates to a method and components for implementing electromagnetic compatibility (EMC) shielded resonance damping.

DESCRIPTION OF THE RELATED ART

Presently, there is a problem with dampening board resonances that occur between the principal planes in a circuit board. Traditionally, for certain intermediate frequency ranges, decoupling capacitors are added into a grid pattern in an attempt to dampen the resonances and additionally to provide some local storage for placed modules.

Since these decoupling capacitors are mainly reactive components, a series resistance of about 5 ohms or less is needed to dissipate the resonant energy.

Dissipative edge termination (DET) arrangements have been developed that essentially place 0805 size resistors at the edge of the board periphery, but known DET arrangements lack the decoupling capacitors that are needed to allow adjacent power planes at different direct current potentials to be damped.

A need exists for an effective mechanism for implementing EMC shielded resonance damping for a printed circuit board.

The term EMC shielding should be understood to include, and to be used interchangeably with, electromagnetic interference (EMI), electrical conduction and/or grounding, corona shielding, radio frequency interference (RFI) shielding, and electro-static discharge (ESD) protection.

As used in the present specification and claims, the term printed circuit board or PCB means a substrate or multiple layers (multi-layer) of substrates used to electrically attach electrical components and should be understood to generally include circuit cards, printed circuit cards, printed wiring cards, and printed wiring boards.

SUMMARY OF THE INVENTION

Principal aspects of the present invention are to provide a method and components for implementing EMC shielded resonance damping of a printed circuit board. Other important aspects of the present invention are to provide such method and components for implementing EMC shielded resonance damping substantially without negative effect and that overcome many of the disadvantages of prior art arrangements.

In brief, a method and components are provided for implementing EMC shielded resonance damping of a printed circuit board. The EMC shielded resonance damping component includes a capacitor and resistor formed in a series combination and contained within a shielded enclosure. A pair of coaxial pads is provided for connection to the printed circuit board. The series combination of the capacitor and resistor is connected between a first pad of a pair of coaxial pads and an interior wall of the shielded enclosure. The shielded enclosure provides a return current path to a second pad of the pair of coaxial pads through the series components.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
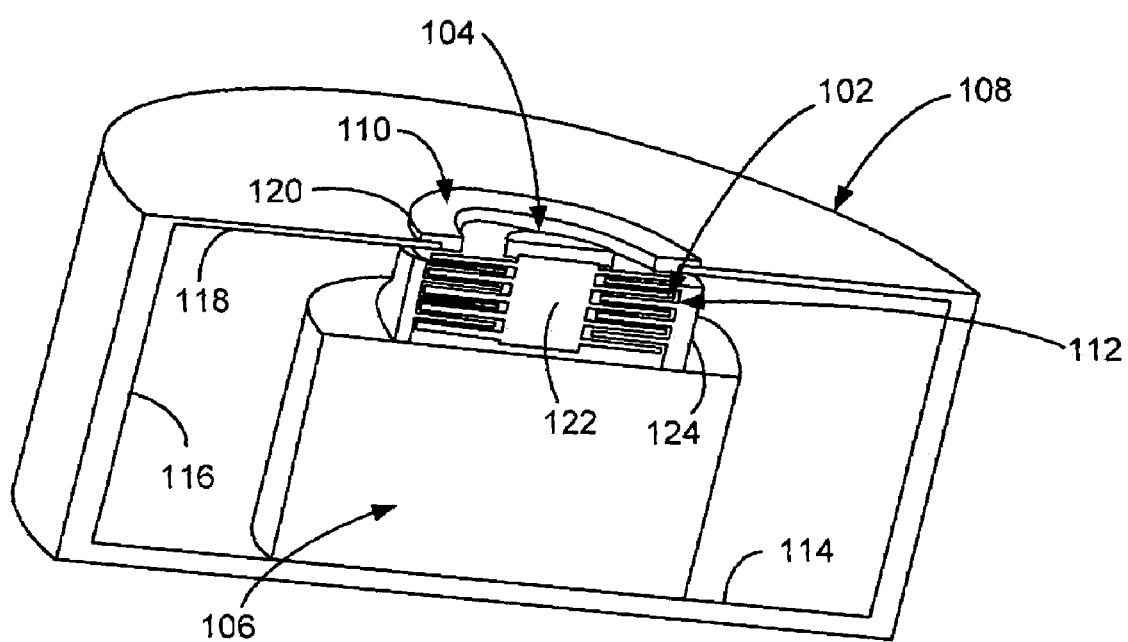
FIG. 1 is a perspective view cut away to show interior detail and not shown to scale of an exemplary EMC shielded resonance damping component arranged in accordance with the preferred embodiment.
Figure 2:
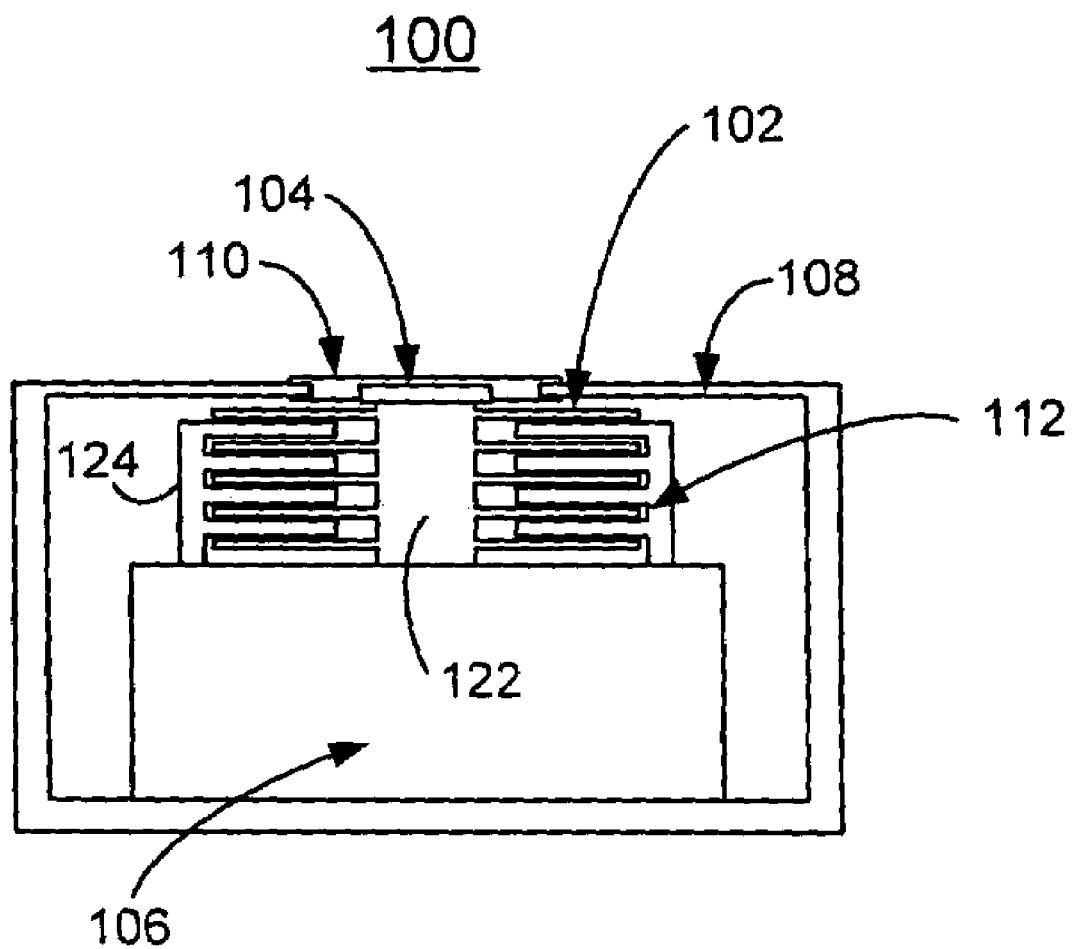
FIG. 2 is a side plan view not shown to scale of the EMC shielded resonance damping component of FIG. 1 in accordance with the preferred embodiment.
Figure 3:
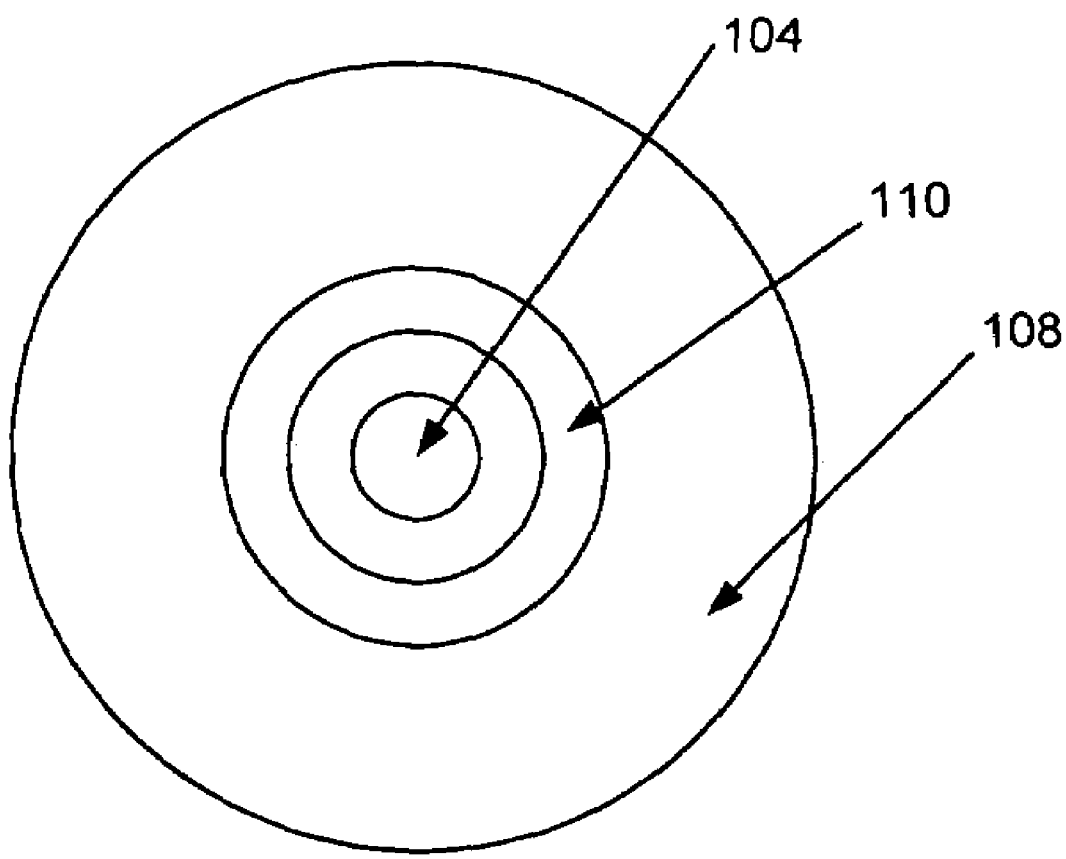
FIG. 3 is an end plan view not shown to scale of the EMC shielded resonance damping component of FIG. 1 in accordance with the preferred embodiment.

Having reference now to the drawings, in FIGS. 1, 2, and 3, there is shown an exemplary EMC shielded resonance damping component generally designated by the reference character 100 including surface mounted device (SMD) packaging in accordance with one preferred embodiment. EMC shielded resonance damping component 100 is arranged to be implemented in a smaller package than a conventional 0805 size package.

As shown in FIGS. 1 and 2, EMC shielded resonance damping component 100 contains a series capacitor generally designated by the reference character 102 connected between a first generally centrally located coaxial pad 104 and one side of a resistor 106. The resistor 106 is formed of a resistive bulk material. The capacitor 102 and resistor 106 are contained within a shielded enclosure 108.

A second coaxial via pad 110 providing a shield connection surrounds the first coaxial pad 104 and is connected to the shielded enclosure 108. The coaxial via pad 110 is closely spaced apart from the first coaxial pad 104. The capacitor 102 includes a plurality of spaced apart parallel plates 112. An opposite side from the capacitor connection of bulk resistor 106 terminates on an interior wall 114 of the shielded enclosure 108. Shielded enclosure 108 returns the current from the series connected capacitor 102 and resistor 106 to the shield connection coaxial via pad 110.

EMC shielded resonance damping component 100 provides the capacitor 102 and resistor 106 in series combination that is adapted to be connected to the printed circuit board with a one port coaxial via structure defined by pads 104, 110.

In accordance with features of the preferred embodiment, the integration of the resistor 106 and capacitor 104 within the same packaging shielded enclosure 108 minimizes board real estate for discrete devices. In conventional arrangements, the action of bringing vias to the printed circuit board surface breaks the shielding integrity of the enclosed printed circuit board planes. Although decoupling is required for local energy storage, it is common to measure radiated emissions from the decoupling capacitors themselves. The shielded enclosure 108 defines an outer shield around the resistor 106 and capacitor 104 that substantially prevents the combination of the resistor 106 and capacitor 104 from radiating emissions.

In accordance with features of the preferred embodiment, EMC shielded resonance damping component 100 can be used on different value voltage planes, including, for example, +V voltage to a ground voltage potential, −V voltage to +V voltage, and ground1 to ground2, one plane respectively connected to pad 104, 110. Multiple EMC shielded resonance damping components 100 advantageously are placed on a printed circuit board to dampen resonance emissions, for example, in a grid pattern or around the PCB periphery, to limit board edge radiation by fence pattern, and to provide some decoupling while replacing a conventional larger non-shielded discrete combination of resistor and capacitor.

In accordance with features of the preferred embodiment, a principal advantage provided over the prior art is the capability of forming a complete and continuous packaging solution using the shielded package 108, mating coaxial via structure of coaxial pad contacts 104, 110. EMC shielded resonance damping component 100 allows the entire circuit current path for normal and common mode current to be shielded against external radiation and radiation from an associated via structure within the circuit board mating with the coaxial via structure 104. The coaxial packaging of the bulk resistor 106 in series with the capacitor 102 allows the current to return along a path defined by inner walls 114, 116, 118 of the shielded enclosure 108 that defines an external barrier and provides a low inductance path back to an outer edge 120 of the coaxial pad contact 110. EMC shielded resonance damping component 100 provides a physically small and compact resistor and capacitor structure that allows the effective frequency of operation to be increased for higher speed digital and RF applications. This is because an increasingly smaller structure becomes more and more electrically small with respect to the operating wavelength. This moves any packaging resonance above the frequency of interest.

The capacitor 102 of the EMC shielded resonance damping component 100 can be implemented with a single dielectric material, such as, air, NPO, X7R, X5R, C0G, YTV, and the like, surrounding the parallel plates 112 of the capacitor 102. Alternate ones of plates 112 extend outwardly from central support 122 forming or connected to the first coaxial pad 104 and spaced from alternate other plates 112 supported by a support member 124 carried by the resistor 106. The dielectric material is a poor conductor of electricity, while an efficient supporter of electrostatic fields that can store energy and particularly useful in capacitor 102. The use of a single dielectric material is the same practice used today by manufacturers of surface mount ceramic capacitors. Various conventional materials can be used to form the capacitor 102 of the EMC shielded resonance damping component 100. For example, a ceramic material, such as fired ceramic powders with various metallic titanates, plus modifier and shifters, or a glass frit material can be used to form the parallel plates 112. Electrodes formed of Palladium and silver or nickel can be used and capacitor terminations formed of silver and glass frit, copper and glass frit, nickel or tin can be used to form the capacitor 102.

In accordance with features of the preferred embodiment, packaging the resistor 106 and capacitor 102 within the same small structure 108 allows the board to be retrofitted or characterized to the level needed to remove board resonances, allowing cost reduction activity to occur without generally changing the printed circuit board.

In accordance with features of the preferred embodiments, there are specific benefits to the unitary shielded structure defined by EMC shielded resonance damping component 100 over placing individual, unshielded resistors and capacitors on a printed circuit board.

EMC shielded resonance damping components 100 includes a particular structure that is designed to minimize size and inductance by containing the capacitance 102 and resistance 106 in one small packaging enclosure 108. This maximizes the frequency response allowing the component 100 to be more effective over a larger frequency range.

Minimizing the size of the EMC shielded resonance damping component 100 also takes up less space on the printed circuit board and allows for these components 100 to be placed closer together which further increases the distributed response over the dimensions of the printed circuit board. Exemplary patterns on a printed circuit board are illustrated and described with respect to FIGS. 5 and 6.

The shielded enclosure 108 of the EMC shielded resonance damping component 100 is also designed to be the return current path. The shielded enclosure 108 is formed of an electrically conductive material, for example, a copper, nickel plated steel material. This allows the shielded enclosure 108 of the EMC shielded resonance damping component 100 to act as a coaxial termination and effectively self contain and dissipate the emissions within the component. Attempting to place a separate shield over standard components would require multiple additional vias around the perimeter and such a shield also would take up even more printed board space. Such arrangement also would increase the loop area of the radiated return currents and compromise the shielding integrity.

The structure or coaxial port defined by the coaxial pad 104 and the shield connection pad 110 of EMC shielded resonance damping component 100 allows for connection to a coaxial via structure to further the benefits of minimized loop area and minimize inductance.

EMC shielded resonance damping component 100 as shown only has one coaxial port. However, it could also be extended to include any range of multiple coaxial port shielded component with various circuit, or integrated circuit structures, internal to the shield.

It should be understood that the present invention is not limited to the illustrated configuration of EMC shielded resonance damping component 100. For example, the capacitor 102 and resistor 106 could be provided with various different shapes and sizes.

It should be understood that the present invention is not limited to the illustrated configuration of EMC shielded resonance damping component 100 with a single coaxial port defined by pads 104, 110. For example, another exemplary EMC shielded resonance damping component with a dual port arrangement for dual port connections is illustrated and described with respect to FIGS. 4A and 4B. An EMC shielded resonance damping component of the invention can be expanded to encompass an N port with N port connections to the printed circuit board. Such an expanded embodiment constitutes active or passive circuits with a fully enclosed shielded package, each including coaxial pad structure defined by pads 104, 110 of the preferred embodiment to effectively contain radiated emissions and provide high speed internal current return paths for higher frequencies.

Figure 4A:
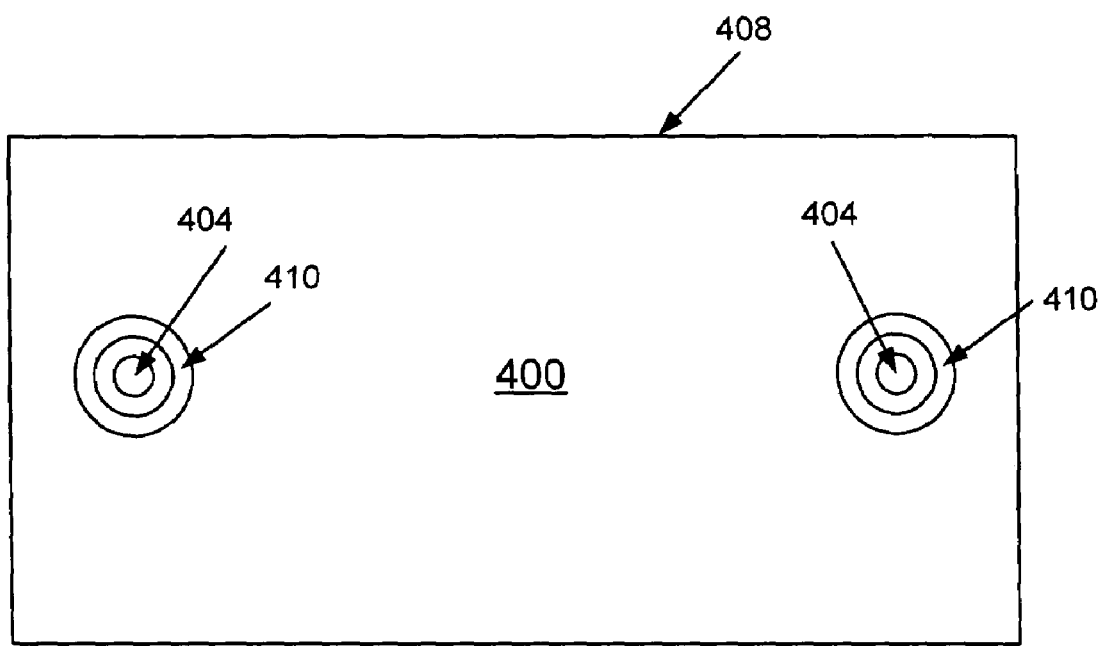
FIG. 4A is an end plan view not shown to scale illustrating another exemplary EMC shielded resonance damping two port component as an example of an N port component arranged in accordance with the preferred embodiment.
Figure 4B:
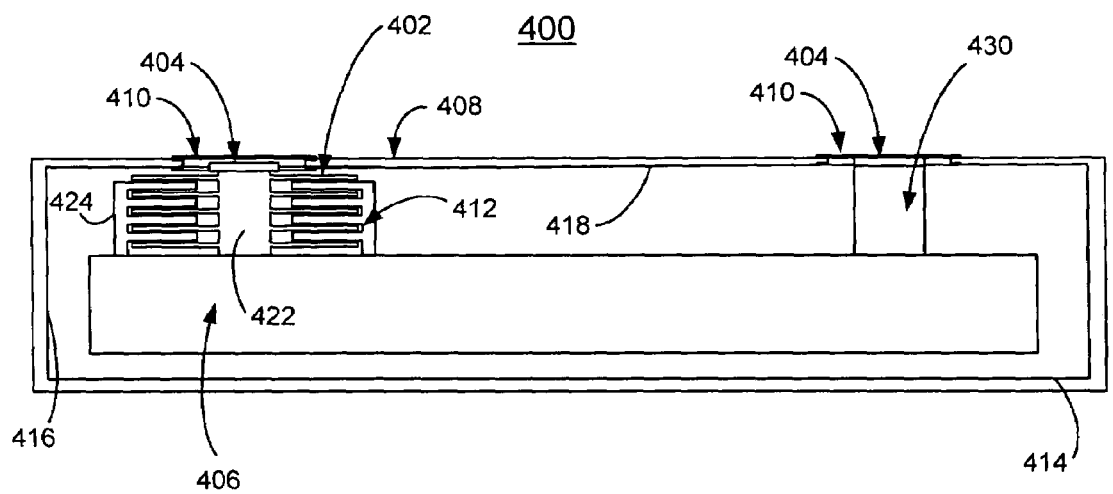
FIG. 4B is a side plan view not shown to scale of the exemplary EMC shielded resonance damping component of FIG. 4A arranged in accordance with the preferred embodiment.

Referring now to FIGS. 4A and 4B, there is shown another exemplary EMC shielded resonance damping two port component generally designated by the reference character 400 including surface mounted device (SMD) packaging in accordance with one preferred embodiment. EMC shielded resonance damping two port component 400 contains a capacitor generally designated by the reference character 402 connected between a respective first generally centrally located coaxial pad 404 of a first port and in series with a resistor 406. Resistor 406 is formed of a resistive bulk material and supports the capacitor 402. The series connected capacitor 402 and resistor 406 are contained within a shielded enclosure 408.

EMC shielded resonance damping two port component 400 includes a pair of coaxial pad structures, each defined by a pair of coaxial via pads 404, 410 of the preferred embodiment contained within the unitary shielded enclosure 408. The series combination of capacitor 402 and resistor 406 is respectively coupled to the respective coaxial via pads 404 of each of the two ports. Each respective second coaxial via pad 410 providing a shield connection surrounds the respective coaxial pad 404 and is connected to the shielded enclosure 408. The coaxial via pad 410 is closely spaced apart from the coaxial pad 404.

Shielded enclosure 408 returns the current from the series connected capacitor 402 and resistor 406 to the shield connection coaxial via pad 410. The coaxial packaging of the respective bulk resistor 406 in series with the respective capacitor 102 allows the current to return along a path defined by inner walls 414, 416, 418 of the shielded enclosure 408 that defines an external barrier and provides a low inductance path back to the coaxial pad contact 410.

Capacitor 402 includes a plurality of spaced apart parallel plates 412. Alternate ones of plates 412 extend outwardly from a central support 422 forming or connected to the respective first coaxial pad 404 and spaced from alternate other plates 412 supported by a support member 424 carried by the resistor 406. An opposite side from the capacitor connection of bulk resistor 406 terminates on a central elongate conductor 430. The coaxial pad 404 of the second port is formed integral with or is connected to the central elongate conductor 430 carried by and electrically connected to the resistor 406.

Figure 5:
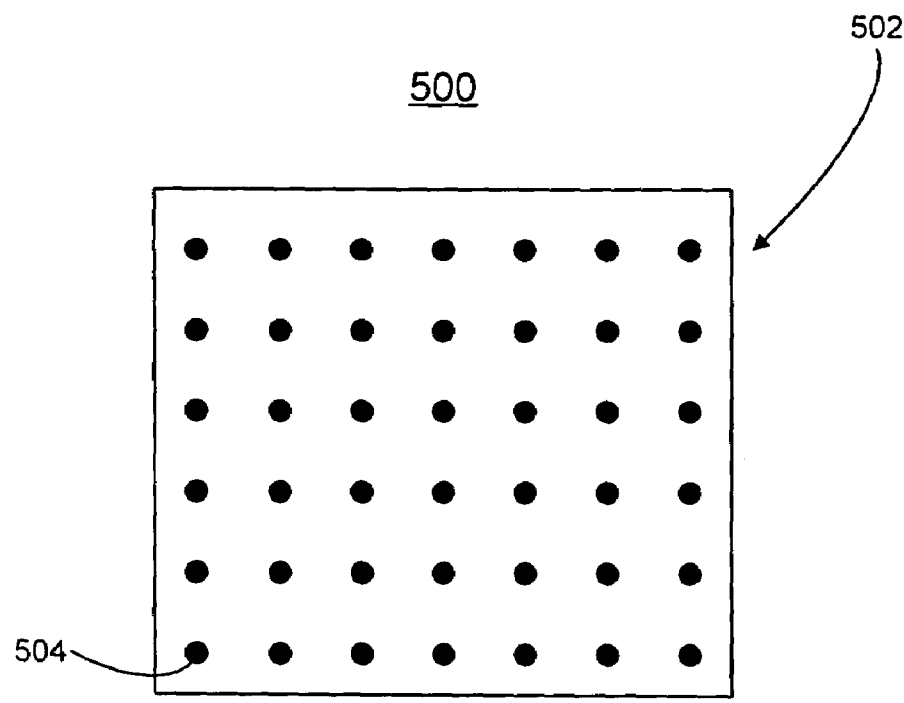
FIGS. 5 and 6 respectively illustrate exemplary printed circuit board layouts for use with the EMC shielded resonance damping components of FIG. 1 in accordance with the preferred embodiment.
Figure 6:
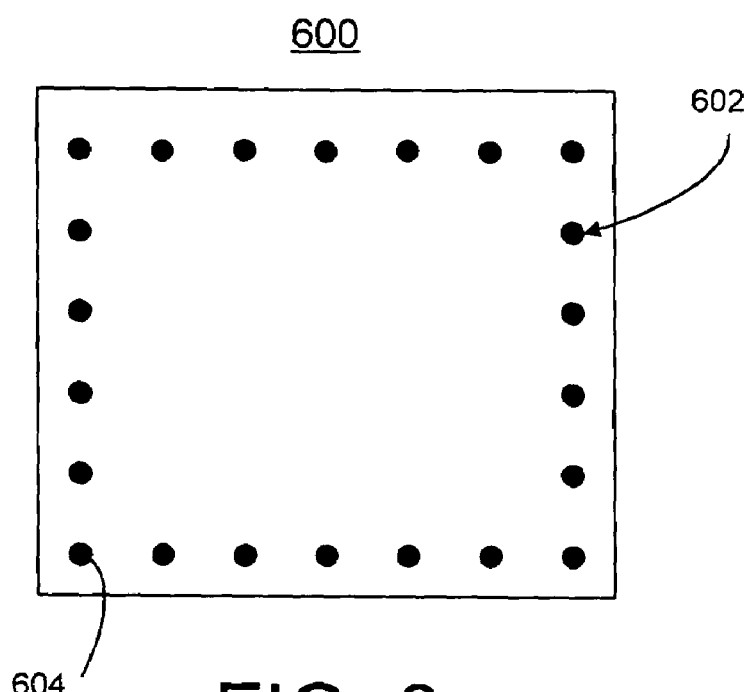

Referring also to FIGS. 5 and 6 there are shown exemplary printed circuit board layouts 500, 600 for use with the EMC shielded resonance damping components 100 in accordance with the preferred embodiment.

Printed circuit board 500 includes a grid 502 of a plurality of coaxial via structures 504, each for mating engagement with one EMC shielded resonance damping component 100, as shown in FIG. 5.

In FIG. 6, printed circuit board 600 includes an edge or peripheral stitch pattern 602 of a plurality of coaxial via structures 604, each for mating engagement with one EMC shielded resonance damping component 100 forming a fence to limit edge radiation.

While the present invention has been described with reference to the details of the embodiments of the invention shown in the drawing, these details are not intended to limit the scope of the invention as claimed in the appended claims.

What is claimed is:

1. A component for implementing EMC shielded resonance damping of a printed circuit board comprising:

a capacitor and a resistor being formed in a series combination;

a shielded enclosure containing and defining an outer shield around said series combination of said capacitor and said resistor;

a pair of spaced apart coaxial pads being adapted for connection to the printed circuit board;

a first side of said resistor carrying a support member extending vertically from said first side of said resistor within said shielded enclosure;

said capacitor including a plurality of parallel plates, said capacitor including alternate ones of said plurality of parallel plates extending outwardly from a central support and electrically connected to said central support;

said capacitor including alternate other ones of said plurality of parallel plates spaced apart from said alternate ones of said plurality of parallel plates extending inwardly from said support member carried by said resistor and electrically connected to said support member;

said series combination of said capacitor and said resistor being connected between a first pad of said pair of spaced apart coaxial pads electrically connected to said central support of said capacitor, and an interior wall of the shielded enclosure electrically connected to a second side of said resistor opposite from said first side; said second pad of said pair of spaced apart coaxial pads electrically connected to said shielded enclosure; and said shielded enclosure providing a return current path to said second pad of said pair of spaced apart coaxial pads.

2. A component for implementing EMC shielded resonance damping as recited in claim 1 wherein said capacitor a dielectric material surrounding said capacitor.

3. A component for implementing EMC shielded resonance damping as recited in claim 2 wherein said dielectric material includes a selected one of the group of dielectric materials including air, NPO, X7R, X5R, C0G, and YTV.

4. A component for implementing EMC shielded resonance damping as recited in claim 1 wherein said capacitor is connected between said first pad of said pair of spaced apart coaxial pads by said central support of said capacitor and said resistor by said support member carried by said resistor.

5. A component for implementing EMC shielded resonance damping as recited in claim 1 wherein said shielded enclosure provides a surface mounted device (SMD) package for connection to a coaxial via structure; said coaxial via structure connected to said coaxial pads.

6. A component for implementing EMC shielded resonance damping as recited in claim 1 wherein said shielded enclosure is formed of a selected one of a group of electrically conductive materials including a copper, nickel plated steel material.

7. A component for implementing EMC shielded resonance damping as recited in claim 1 wherein, said second pad surrounding said first pad and defining a shield around said first pad.

8. A component for implementing EMC shielded resonance damping as recited in claim 7 wherein said resistor is formed of a bulk resistance material.

9. A component for implementing EMC shielded resonance damping as recited in claim 1 wherein said pair of coaxial pads are connected to a coaxial via structure of the printed circuit board.

10. A component for implementing EMC shielded resonance damping as recited in claim 1 wherein said return current path is provided along interior walls of said shielded enclosure.

11. A component for implementing EMC shielded resonance damping as recited in claim 1 wherein said series combination of said capacitor and said resistor are formed in line with said pair of coaxial pads.

12. A component for implementing EMC shielded resonance damping as recited in claim 1 wherein said coaxial pads are connected to a coaxial via structure of the printed circuit board, whereby area of the printed circuit board is minimized.

13. A method for implementing EMC shielded resonance damping of a printed circuit board with an EMC shielded resonance damping component, said method comprising the steps of:

forming a capacitor and a resistor in a series combination;

containing said series combination of said capacitor and said resistor in a shielded enclosure; said shielded enclosure defining an outer shield around said series combination of said capacitor and said resistor;

providing a support member carried by a first side of said resistor, said support member extending vertically from said first side of said resistor within said shielded enclosure; said capacitor including a plurality of parallel plates, said capacitor including alternate ones of said plurality of parallel plates extending outwardly from a central support and electrically connected to said central support; said capacitor including alternate other ones of said plurality of parallel plates spaced apart from said alternate ones of said plurality of parallel plates extending inwardly from said support member carried by said resistor and electrically connected to said support member;

providing a pair of spaced apart coaxial pads for connection to the printed circuit board;

electrically connecting said series combination of said capacitor and said resistor with a first pad of said pair of coaxial pads electrically connected to said central support of said capacitor and an interior wall of the shielded enclosure electrically connected to a second, opposite side of said resistor from said first side;

electrically connecting said second pad to said shielded enclosure; said second pad surrounding said first pad; and providing a return current path to said second pad of the pair of coaxial pads with said shielded enclosure.

14. A method for implementing EMC shielded resonance damping as recited in claim 13 includes the steps of providing a plurality of the EMC shielded resonance damping components on the printed circuit board in a selected pattern.

15. A method for implementing EMC shielded resonance damping as recited in claim 13 includes the steps of providing a plurality of the EMC shielded resonance damping components on the printed circuit board in a grid pattern on the printed circuit board.

16. A method for implementing EMC shielded resonance damping as recited in claim 13 includes the steps of providing a plurality of the EMC shielded resonance damping components on the printed circuit board in a peripheral edge pattern around the printed circuit board.

17. A component for implementing EMC shielded resonance damping of a printed circuit board comprising:

a pair of spaced apart coaxial pads being adapted for connection to the printed circuit board;

a capacitor connected to a first pad of said pair of coaxial pads, said capacitor including a plurality of parallel plates;

a resistor connected in a series with said capacitor;

a shielded enclosure containing and defining an outer shield around said capacitor and said resistor; said shielded enclosure connected to a second pad of said pair of spaced apart coaxial pads; said resistor being carried by and electrically connected to an interior wall of said shielded enclosure;

an opposite side of said resistor from said interior wall carrying a support member extending vertically from said resistor within said shielded enclosure;

said capacitor including alternate ones of said plurality of parallel plates extending outwardly from a central support and electrically connected to said central support; said central support electrically connected to said first pad of said pair of spaced apart coaxial pads;

said capacitor including alternate other ones of said plurality of parallel plates spaced apart from said alternate ones of said plurality of parallel plates extending inwardly from said support member carried by said resistor and electrically connected to said support member; and said shielded enclosure providing a return current path to said second pad of said pair of coaxial pads.

18. A component for implementing EMC shielded resonance damping as recited in claim 17 wherein said second pad surrounding said first pad and defining a shield around said first pad.

19. A component for implementing EMC shielded resonance damping as recited in claim 17 wherein said shielded enclosure provides a surface mounted device (SMD) package for connection to a coaxial via structure; said coaxial via structure connected to said coaxial pads.

20. A component for implementing EMC shielded resonance damping as recited in claim 17 includes a plurality of the EMC shielded resonance damping components connected to the printed circuit board in a selected pattern.

* * * * *